United States Patent
Bergman et al.

(10) Patent No.: US 9,659,478 B1
(45) Date of Patent: May 23, 2017

(54) WEARABLE ELECTRONIC STRESS AND STRAIN INDICATOR

(71) Applicant: Multek Technologies Ltd., San Jose, CA (US)

(72) Inventors: Mark Bergman, Redwood City, CA (US); Michael James Glickman, Mountain View, CA (US)

(73) Assignee: Multek Technologies, Ltd., San Jose, CA (US)

( * ) Notice: Subject to any disclaimer, the term of this patent is extended or adjusted under 35 U.S.C. 154(b) by 0 days.

(21) Appl. No.: 14/572,610

(22) Filed: Dec. 16, 2014

Related U.S. Application Data

(60) Provisional application No. 61/916,722, filed on Dec. 16, 2013.

(51) Int. Cl.
*G08B 21/00* (2006.01)
*G08B 21/18* (2006.01)
*G01L 1/22* (2006.01)

(52) U.S. Cl.
CPC .............. *G08B 21/182* (2013.01); *G01L 1/22* (2013.01)

(58) Field of Classification Search
None
See application file for complete search history.

(56) References Cited

U.S. PATENT DOCUMENTS

| | | | |
|---|---|---|---|
| 3,471,348 A | 10/1969 | Iles | |
| 3,951,493 A | 4/1976 | Kozel | |
| 4,481,258 A | 11/1984 | Sattler | |
| 4,733,383 A * | 3/1988 | Waterbury | G04G 21/02 368/10 |
| 4,931,021 A | 6/1990 | Mohan | |
| 4,999,136 A | 3/1991 | Su | |
| 5,184,827 A * | 2/1993 | Suttle | A63B 69/0059 2/161.3 |
| 5,259,833 A * | 11/1993 | Barnett | A61F 5/026 2/44 |
| 5,555,915 A | 9/1996 | Kanao | |
| 5,764,498 A | 6/1998 | Sundstrom | |
| 5,778,941 A | 7/1998 | Inada | |
| 5,816,848 A | 10/1998 | Zimmerman | |
| 6,103,971 A | 8/2000 | Sato et al. | |
| 6,160,254 A * | 12/2000 | Zimmerman | A43B 3/0005 250/225 |
| 6,172,344 B1 | 1/2001 | Gordon et al. | |
| 6,192,940 B1 | 2/2001 | Koma et al. | |
| 6,307,751 B1 | 10/2001 | Bodony | |

(Continued)

*Primary Examiner* — Curtis King
(74) *Attorney, Agent, or Firm* — Haverstock & Owens LLP

(57) ABSTRACT

A stress and/or strain indicator comprises a wearable body, one or more flexible sections, one or more rigid sections and one or more strain gauges. The one or more strain gauges detect a level of stress and/or strain applied to the wearable body in order to indicate when the product is in danger of failing. A warning is activated based upon the level of stress and/or strain applied to the wearable body. For example, the stress and/or strain indicator is able to display a visual and/or an audible warning that a high level of stress and/or strain has been applied to the wearable body and the product is in danger of failing. In some embodiments, the stress and/or strain incident is recorded and downloadable. Consequently, a user is better informed as to when the electronic product is in danger of failing because of damage or misuse.

24 Claims, 2 Drawing Sheets

(56) References Cited

U.S. PATENT DOCUMENTS

| | | | |
|---|---|---|---|
| 6,339,193 B1 | 1/2002 | Goett et al. | |
| 6,349,201 B1* | 2/2002 | Ford | H04B 1/385 |
| | | | 2/455 |
| 6,591,463 B2 | 7/2003 | Wang | |
| 6,711,024 B1 | 3/2004 | Johansson | |
| 6,743,982 B2 | 6/2004 | Biegelsen | |
| 6,747,227 B2 | 6/2004 | Marmaropoulos et al. | |
| 6,797,881 B2 | 9/2004 | Nakamura | |
| 6,805,568 B2 | 10/2004 | Kuzmenka | |
| 7,019,973 B2 | 3/2006 | Rivera | |
| 7,156,127 B2 | 1/2007 | Moulton et al. | |
| 7,234,831 B1 | 6/2007 | Hanley | |
| 7,319,895 B2 | 1/2008 | Klefstad-Sillonville | |
| 7,491,892 B2 | 2/2009 | Wagner | |
| 7,494,238 B2 | 2/2009 | Kuo | |
| 7,629,691 B2 | 12/2009 | Roush | |
| 7,735,523 B2 | 6/2010 | Smith et al. | |
| 7,795,540 B2 | 9/2010 | Yamada | |
| 8,157,730 B2* | 4/2012 | LeBoeuf | A61B 5/11 |
| | | | 128/920 |
| 8,207,473 B2 | 6/2012 | Axisa | |
| 8,283,602 B2 | 10/2012 | Augustine et al. | |
| 8,467,726 B2* | 6/2013 | Shirakata | A61B 5/0002 |
| | | | 340/539.1 |
| 9,018,532 B2 | 4/2015 | Wesselmann | |
| 2002/0076948 A1 | 6/2002 | Farrell | |
| 2003/0093248 A1* | 5/2003 | Vock | A42B 3/0433 |
| | | | 702/188 |
| 2003/0098084 A1 | 5/2003 | Ragner et al. | |
| 2003/0111126 A1 | 6/2003 | Moulton et al. | |
| 2003/0129905 A1 | 7/2003 | Dhawan et al. | |
| 2004/0111045 A1* | 6/2004 | Sullivan | A61B 5/11 |
| | | | 600/595 |
| 2004/0259391 A1 | 12/2004 | Jung | |
| 2005/0022338 A1 | 2/2005 | Muhlenkamp | |
| 2005/0154264 A1* | 7/2005 | Lecompte | A61B 5/4884 |
| | | | 600/300 |
| 2005/0224993 A1 | 10/2005 | Manepalli et al. | |
| 2006/0128346 A1 | 6/2006 | Yasui | |
| 2006/0282018 A1* | 12/2006 | Balzano | A61B 5/1036 |
| | | | 600/587 |
| 2007/0001844 A1 | 1/2007 | Krill | |
| 2007/0125295 A1* | 6/2007 | Sanguinetti | A43B 1/0027 |
| | | | 116/200 |
| 2007/0190881 A1 | 8/2007 | Shibaoka et al. | |
| 2007/0232455 A1* | 10/2007 | Hanoun | A63B 21/225 |
| | | | 482/8 |
| 2008/0060873 A1* | 3/2008 | Lang | A62B 35/0018 |
| | | | 182/3 |
| 2008/0182475 A1 | 7/2008 | Gnade | |
| 2008/0223844 A1 | 9/2008 | Cronn | |
| 2008/0241663 A1 | 10/2008 | Yamashita | |
| 2008/0258314 A1 | 10/2008 | Yoo | |
| 2008/0271220 A1 | 11/2008 | Chilton | |
| 2009/0309739 A1* | 12/2009 | Ezer | G08B 21/088 |
| | | | 340/573.6 |
| 2010/0090834 A1* | 4/2010 | Buchnick | A61B 5/1117 |
| | | | 340/573.1 |
| 2010/0325770 A1 | 12/2010 | Chung | |
| 2011/0063098 A1* | 3/2011 | Fischer | G07C 9/00119 |
| | | | 340/439 |
| 2011/0119812 A1 | 5/2011 | Genz | |
| 2011/0130060 A1 | 6/2011 | Chung et al. | |
| 2011/0175630 A1 | 7/2011 | Bhattacharya | |
| 2011/0245633 A1* | 10/2011 | Goldberg | A61B 5/681 |
| | | | 600/301 |
| 2011/0262785 A1 | 10/2011 | Johnson | |
| 2012/0050036 A1* | 3/2012 | Landry | G08B 25/016 |
| | | | 340/540 |
| 2012/0176764 A1 | 7/2012 | Loher | |
| 2012/0306643 A1* | 12/2012 | Dugan | A61B 5/02 |
| | | | 340/539.12 |
| 2013/0183646 A1* | 7/2013 | Lusted | G09B 19/00 |
| | | | 434/236 |
| 2013/0216065 A1* | 8/2013 | Nguyen | G08B 21/043 |
| | | | 381/94.1 |
| 2013/0247288 A1 | 9/2013 | Kotos | |
| 2014/0124257 A1 | 5/2014 | Yoshihara | |
| 2014/0220422 A1 | 8/2014 | Rogers | |
| 2014/0275857 A1* | 9/2014 | Toth | A61B 5/087 |
| | | | 600/301 |
| 2014/0362020 A1* | 12/2014 | Rothkopf | G06F 1/1652 |
| | | | 345/173 |
| 2015/0009129 A1* | 1/2015 | Song | G06F 1/1652 |
| | | | 345/156 |
| 2015/0091711 A1* | 4/2015 | Kosonen | G08B 6/00 |
| | | | 340/407.1 |
| 2015/0109124 A1* | 4/2015 | He | G06F 21/00 |
| | | | 340/539.12 |
| 2015/0185944 A1* | 7/2015 | Magi | G06F 1/1652 |
| | | | 345/174 |
| 2015/0245777 A1* | 9/2015 | Della Torre | A61B 5/11 |
| | | | 600/301 |
| 2015/0312653 A1* | 10/2015 | Avrahami | H04Q 9/00 |
| | | | 340/870.07 |
| 2016/0034634 A9* | 2/2016 | Hong | A61B 5/4866 |
| | | | 702/19 |
| 2016/0187122 A1* | 6/2016 | Krimon | G01B 11/16 |
| | | | 340/679 |

* cited by examiner

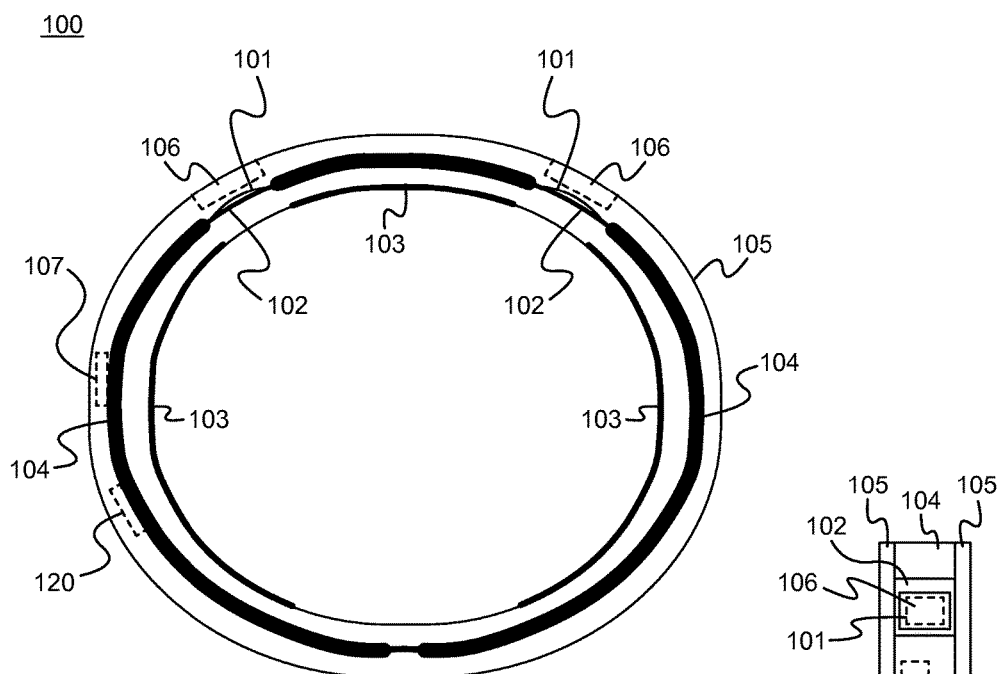
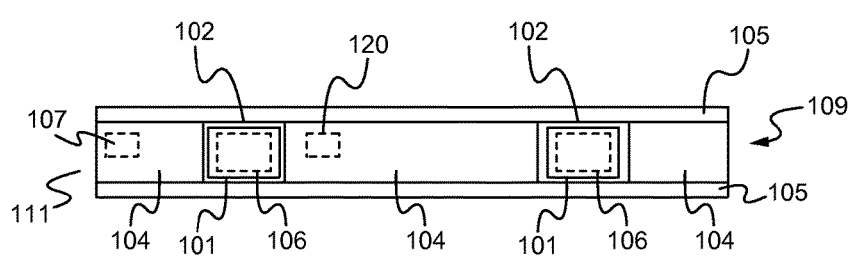
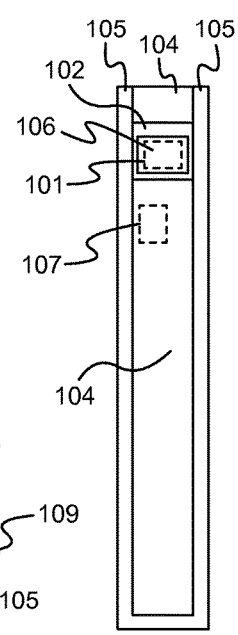
Fig. 1A
Fig. 1B
Fig. 1C

WEARABLE ELECTRONIC STRESS AND STRAIN INDICATOR

RELATED APPLICATIONS

This Patent Application claims priority under 35 U.S.C. 119(e) of the U.S. provisional patent application, Application No. 61/916,722, filed on Dec. 17, 2013, and entitled "NANO-COPPER VIA FILL FOR THERMAL PLATED THROUGH HOLE APPLICATIONS," which is also hereby incorporated by reference in its entirety.

FIELD OF THE INVENTION

The present invention is generally directed to wearable electronics and wearable electronic medical devices. More specifically, the present invention is directed to gauges and methods for indicating when the product is in danger of failing.

BACKGROUND OF THE INVENTION

Electronic devices are increasingly being developed so as to be worn by a user, such as in wearable electronics and medical devices. These wearable electronics are bent, flexed and stretched as they are worn and used during activity. Consequently, the electronic devices are susceptible to wear and tear and can inadvertently fail or stop working without knowledge of the user.

SUMMARY OF THE INVENTION

A stress and strain indicator comprises a wearable body, one or more flexible sections, one or more rigid sections and one or more strain gauges. The one or more strain gauges detect a level of stress and/or strain applied to the wearable body in order to indicate when the product is in danger of failing. A warning is activated based upon the level of stress and/or strain applied to the wearable body. For example, the stress and strain indicator is able to display a visual and/or an audible warning that a high level of stress and/or strain has been applied to the wearable body and the product is in danger of failing. Particularly, the stress and strain indicator can be used for in vivo and in vitro applications with wearable medical electronic devices. Additionally, the stress and strain indicator may be worn on an exterior of the body and around a body part such as a bracelet. In some embodiments, the stress and/or strain incident is recorded and downloadable. Consequently, a user is better informed as to when the electronic product is in danger of failing because of damage or misuse. The stress and strain indicator is able to detect damage to a device based upon drops, falls, removal of the body worn device from the area of application, and other stress and strains applied to the device as it is moved.

In one aspect, a wearable electronic stress and strain indicator comprises a wearable body, a strain gauge coupled to the wearable body and a warning indicator which indicates a warning based upon a level of stress and/or strain applied to the wearable body. In some embodiments, the body comprises a molded band. In some embodiments, the body comprises a rigid section and a flexible section. The flexible section is located at a high stress area of the wearable body. In some embodiments, the strain gauge is located at the flexible section. In some embodiments, the warning indicator displays a visual alert if the stress to the wearable body is greater than a threshold amount. In further embodiments, the warning indicator displays an audio alert if the stress and/or strain applied to the wearable body is greater than a threshold amount. In some embodiments, the wearable stress and strain indicator comprises a recorder for recording a stress and/or strain incident to the wearable body. After the stress and/or strain incident is recorded, the stress and/or strain incident is downloadable. In some embodiments, the stress and/or strain incident is downloadable by a user of the wearable stress and/or strain indicator. In further embodiments, the stress and/or strain incident is downloadable by an original equipment manufacturer of the wearable stress and/or strain indicator.

In another aspect, an electronic system for detecting a level of stress and/or strain applied to a wearable product comprises a strain gauge for detecting a stress and/or strain applied to the wearable body, a warning indicator and a control device, wherein the strain gauge sends a signal to the control device based upon a stress and/or strain applied to the wearable body and the control device operates the warning indicator based upon the signal from the strain gauge. In some embodiments, the control device only operates the warning indicator if the stress and/or strain to the wearable body is greater than a threshold level. In some of these embodiments, the warning indicator displays a visual alert if the stress and/or strain to the wearable body is greater than the threshold level. In further embodiments, the warning indicator displays an audio alert if the stress and/or strain to the wearable body is greater than the threshold level. In some embodiments, the system comprises a recorder for recording the stress and/or strain incident to the wearable body and the stress and/or strain incident is downloadable. In some embodiments, the stress and/or strain incident is downloadable by a user of the wearable body. In some embodiments, the stress and/or strain incident is wirelessly sent to an electronic media device such as a smart phone, a tablet, and a computer.

In further embodiments, the stress and/or strain incident is downloadable by an original equipment manufacturer of the electronic system.

In a further aspect, a method of indicating a level of stress and/or strain applied to a wearable body, the method comprises sensing a level of stress and/or strain applied to the wearable body, sending a signal to a control device based upon the level of stress and/or strain applied to the wearable body, and activating a warning based upon the level of stress and/or strain applied to the wearable body. In some embodiments, the warning is only activated if the stress and/or strain to the wearable body is greater than a threshold amount. The level of stress and/or strain applied to the wearable body is recordable and downloadable.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 1A illustrates a front cross-section view of a wearable electronic stress and/or strain indicator in accordance with some embodiments.

FIG. 1B illustrates a top view of a wearable electronic stress and/or strain indicator in accordance with some embodiments.

FIG. 1C illustrates a side view of a wearable electronic stress and/or strain indicator in accordance with some embodiments.

DETAILED DESCRIPTION OF THE EMBODIMENTS

Figure 2:
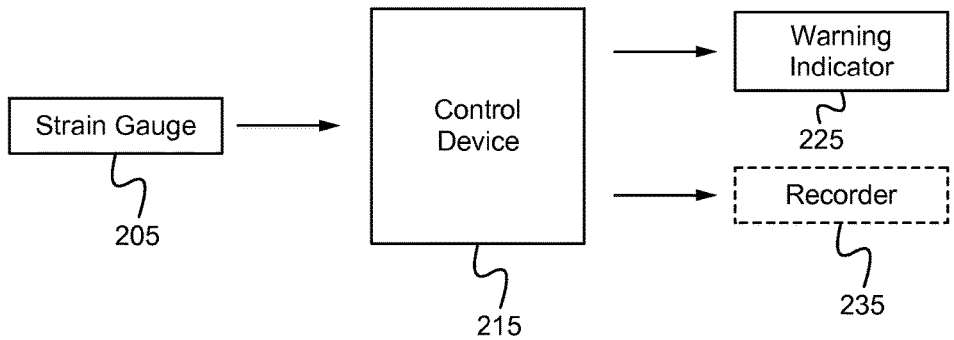
FIG. 2 illustrates a schematic view of an electronic system for detecting a level of stress and/or strain applied to a wearable product in accordance with some embodiments.

Embodiments of the invention are directed to a wearable electronic stress and/or strain indicator. The stress and/or strain indicator comprises a wearable body, one or more flexible sections, one or more rigid sections and one or more strain gauges. The one or more strain gauges detect a level of stress and/or strain applied to the wearable body in order to indicate when the product is in danger of failing. A warning is activated based upon the level of stress and/or strain applied to the wearable body. For example, the stress and/or strain indicator is able to display a visual and/or an audible warning that a high level of stress and/or strain has been applied to the wearable body and the product is in danger of failing. In some embodiments, the stress and/or strain incident is recorded and downloadable. Consequently, a user is better informed as to when the electronic product is in danger of failing because of damage or misuse.

Reference will now be made in detail to implementations of the wearable electronic stress and/or strain indicator as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Referring now to FIG. 1A, a front view of a wearable electronic stress and/or strain indicator showing a wearable cross-section of the device is depicted therein. The wearable electronic stress and/or strain indicator 100 comprises a wearable body 105, one or more strain gauges 101 coupled to the wearable body 105, one or more warning indicators 106, and a metal and/or plastic access plate 103 for accessing the internal components of the wearable body 105. As shown in FIG. 1A, the wearable body 105 is a molded wearable band material, however, the wearable body 105 is able to be any appropriately desired shape. For example, in some embodiments, the wearable body 105 comprises a component of a larger wearable product such as a pair of shoes, a vest, glasses and a shirt.

The wearable body 105 comprises one or more flexible sections 102 and one or more rigid sections 104. In some embodiments, the one or more strain gauges 101 are attached to the one or more flexible sections 102. Attaching the one or more strain gauges 101 to the one or more flexible sections 102 locates the one or more strain gauges 101 at a high stress and/or strain area of the body 105 as it flexes during movement by a user. The one or more strain gauges 101 detect a stress and/or strain to the wearable body 105 and may determine when the product is in danger of failing.

In some embodiments, the one or more strain gauges 101 detect a stress and/or strain to the body 105 and the one or more warning indicators 106 issue a warning alert. In some embodiments, the alert comprises a visual alert such as an LED light. Alternatively or in combination, the alert comprises an audible alert. In some embodiments, the one or more strain gauges 101 detect a stress and/or strain level that indicates that the wearable body 105 is in danger of failing due to abuse. In response, the one or more warning indicators 106 issue a warning that the product is in danger of failing. In some embodiments, the wearable electronic stress and/or strain indicator 100 is programmed with a threshold stress and/or strain level at which point the product is in danger of failing and the one or more warning indicators 106 only issue a warning if the one or more strain gauges 101 detect a stress and/or strain at or greater than the threshold level. Alternatively, the warning indicator issues a warning at any stress and/or strain level detected by the one or more strain gauges 101.

In some embodiments, the one or more warning indicators 106 collectively indicate a plurality of stress and/or strain incidents. For example, the one or more strain gauges 101 detect a plurality of low level stress and/or strain incidents, which are stored in a memory device 120 of the electronic stress and/or strain indicator 100. The one or more warning detectors 106 are able to indicate a cumulative amount of damage to the wearable body 105, as the damage to the wearable body increases and the cumulative damage reaches the threshold stress and/or strain level. This allows the one or more warning indicators 106 to indicate a warning if the device is in danger of failing from stress and/or strain to the body based on the plurality of stress and/or strain events over an extended period of time. In this manner, the electronic stress and/or strain indicator 100 is able to inform the user as the product degrades over time and is in danger of failing from cumulative abuse.

As shown in FIG. 1A, in some embodiments, the wearable electronic stress and/or strain indicator 100 comprises a recorder 107 for recording a stress and/or strain event. A recorded stress and/or strain event is able to be stored and downloaded by a user or the original equipment manufacturer. For example, in some embodiments a stress and/or strain event is stored in the memory device 120 of the stress and/or strain indicator 100. The memory 120 is able to comprise any appropriate conventional memory as known in the art. Specifically, the memory 120 is able to store individual stress and/or strain events or a log of stress and/or strain events which are retrievable when the stress and/or strain indicator 100 is connected to a computing device or internet, using conventional methods as known in the art.

FIG. 1B illustrates a top view of the wearable electronic stress and/or strain indicator as described in relation to FIG. 1A. As described above, the wearable electronic stress and/or strain indicator 100 comprises a wearable body 105, one or more strain gauges 101 coupled to the wearable body 105, one or more warning indicators 106, and a metal and/or plastic access plate 103 for accessing the internal components of the wearable body 105. As shown in FIG. 1B, the one or more strain gauges 101 are coupled to the one or more flexible sections 102 of the wearable body 105. The one or more strain gauges 101 detect a stress and/or strain to the body 105 and the one or more warning indicators 106 indicate a warning based upon the stress and/or strain incident. As further described above, in some embodiments the stress and/or strain incident is recorded by a recorder 107 and is downloadable from a memory device 120.

FIG. 1B shows the wearable body 105 as a wearable band material comprising a first end 109 and a second end 111. In some embodiments, the first end 109 and the second end 111 removably couple in order to form the wearable body 105 as shown in FIG. 1A. In some embodiments, the wearable body 105 comprises a single continuous loop which is able to stretch over a wrist or other appendage of the user. Alternatively, as described above, the wearable body 105 is a molded wearable band material, however, the wearable body 105 is able to be any appropriately desired shape.

FIG. 1C illustrates a side view of the wearable electronic stress and/or strain indicator as described in relation to FIG. 1A. As described above, the wearable electronic stress and/or strain indicator 100 comprises a wearable body 105, one or more strain gauges 101 coupled to the wearable body 105, one or more warning indicators 106, and a metal and/or plastic access plate 103 for accessing the internal components of the wearable body 105. As shown in FIG. 1B, the one or more strain gauges 101 are coupled to the one or more flexible sections 102 of the wearable body 105. The one or more strain gauges 101 detect a stress and/or strain to the body 105 and the one or more warning indicators 106 indicate a warning based upon the stress and/or strain incident. As further described above, in some embodiments the stress and/or strain incident is recorded by a recorder 107 and is downloadable from a memory device 120.

Referring now to FIG. 2, a schematic view of a electronic system for detecting a level of stress and/or strain applied to a wearable product is show therein. The system 200 comprises a strain gauge 205 for detecting a stress and/or strain applied to the wearable product, a warning indicator 225 and a control device 215. The strain gauge 205 sends a signal to the control device 215 based upon a stress and/or strain to the wearable product and the control device 215 sends a signal to the warning indicator 225 which issues a warning based upon the signal from the control device 215. In some embodiments, the system 200 is implemented with a wearable device such as described in relation to FIG. 1, above.

In some embodiments, the strain gauge 205 detects a stress and/or strain to the wearable product and sends a signal to the control device 215, and in response the control device 215 sends a signal to the warning indicator 225 to issue a warning. The strain gauge 205 is able to be located at a flexible section and/or high stress and/or strain of the wearable product in order to movement and stress and/or strain events to the wearable product as it is worn and used. In some embodiments, the control device 215 only sends a signal to the warning indicator 225 to issue a warning if the stress and/or strain event is above a threshold level. In some embodiments, the alert comprises a visual alert such as an LED light. Alternatively, in some embodiments, the alert comprises an audible alert. In some embodiments, the warning indicator 225 indicates a plurality of stress and/or strain incidents stored in a memory device of the system 200, such as described above. The memory device stores a plurality of stress and/or strain events and warning indicator 225 indicates a cumulative amount of damage, as the damage to the system increases and/or the system 200 is in danger of failing from cumulative abuse.

As shown in FIG. 2, in some embodiments, the system 200 comprises a recorder 235 for recording a stress and/or strain event. A recorded stress and/or strain event is able to be stored and downloaded by a user or the original equipment manufacturer, as described above.

Figure 3:
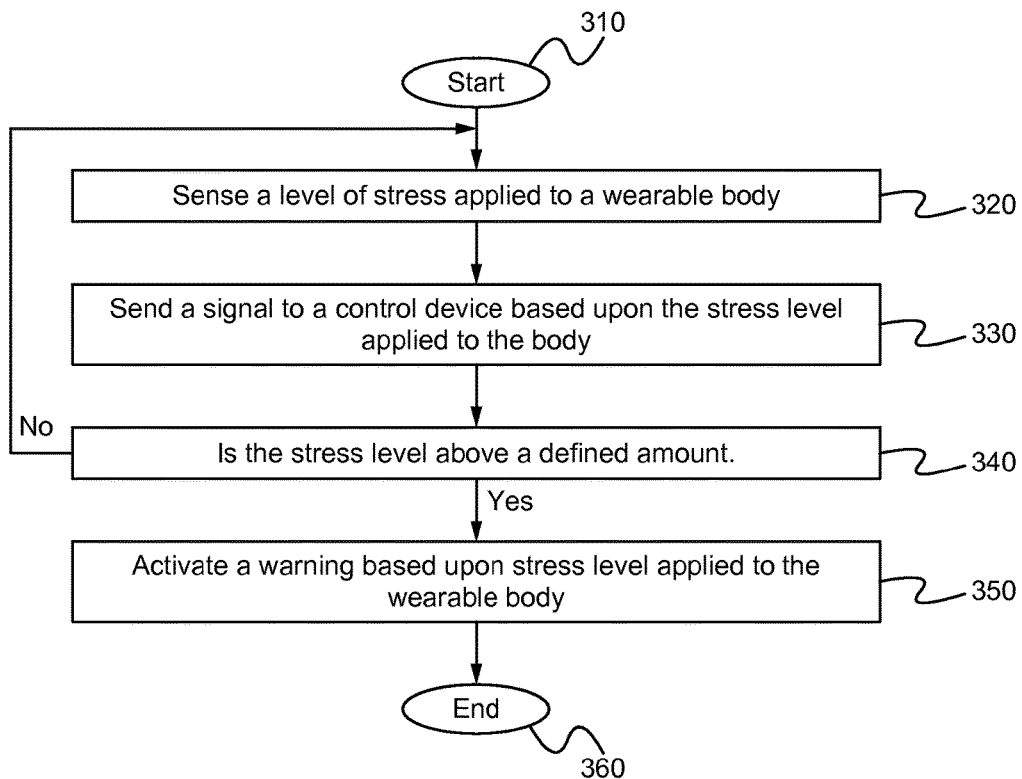
FIG. 3 illustrates a method of indicating a level of stress and/or strain applied to a wearable body in accordance with some embodiments.

FIG. 3 illustrates a method of indicating a level of stress and/or strain applied to wearable product such as described above. The method begins in the step 310. In the step 320, a level of stress and/or strain applied to the wearable product is sensed. For example, in some embodiments, a strain gauge is used to sense a stress and/or strain applied to a high stress and/or strain area of the wearable product. In the step 330 a signal is sent to a control device based upon the stress and/or strain level applied to the wearable product and in the step 340 it is determined whether the stress and/or strain level is above a defined amount. For example, in some embodiments, it is determined if the stress and/or strain to the wearable body is at a level in which the body may become damaged or is in danger of failing. If it is determined that the stress and/or strain to the wearable product is below the defined amount, then the method continues to the step 320 where the level of stress and/or strain applied to the body is sensed.

If it is determined in the step 340 that the stress and/or strain to the wearable body is above the defined amount, then in the step 350 a warning is activated based upon the stress and/or strain applied to the wearable body. In some embodiments, the alert comprises a visual alert such as an LED light. Alternatively or in combination, the alert comprises an audible alert. In some embodiments, the method further comprises recording and storing the stress and/or strain incident. In some embodiments, the stress and/or strain incident is downloaded. The method ends in the step 360.

In operation a wearable electronic stress and/or strain indicator is able to warn a user when a wearable product is in danger of failing due to abuse. One or more strain gauges placed on a high stress and/or strain area of the product are able to measure a stress and/or strain applied to the wearable product. Once a level of stress and/or strain is applied to product the strain gauges are able to send an electrical signal and a warning is displayed in order to indicate the stress and/or strain to the product. The wearable electronic is able to display an audio or visual warning in order to alert the user to the stress and/or strain to the wearable product. Additionally, the stress and/or strain incident is able to be recorded within the wearable product so that it is able to be retrieved by the original equipment manufacturer and/or the user of the product.

Specifically, adding a wearable electronic stress and/or strain indicator to a wearable electronic better informs the user of the wearable electronic is danger of failing because of stress and/or strain to the product or misuse. Particularly, the stress and/or strain indicator enables the user of the product to adjust their behavior in order to avoid damaging the wearable electronic and also allows the original manufacturer to track damage to the device and failures in order to improve future designs. Accordingly, the wearable electronic stress and/or strain indicator as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to fold any appropriate flexible circuit and to insert the circuit within the circuit housing.

What is claimed is:

1. A wearable electronic stress and strain indicator comprising:
   a. a wearable body,
   b. a strain gauge coupled to the wearable body; and
   c. a warning indicator which indicates a warning based upon a level of stress and/or strain applied to the wearable body, and wherein the warning indicator indicates a warning that the electronic stress and strain indicator is in danger of failing.

2. The wearable stress and/or strain indicator of claim 1, wherein the body comprises a molded band.

3. The wearable stress and/or strain indicator of claim 1, wherein the body comprises a rigid section and a flexible section.

4. The wearable stress and/or strain indicator of claim 3, wherein the flexible section is located at a high stress and/or strain area of the wearable body.

5. The wearable stress and/or strain indicator of claim 3, wherein the strain gauge is located at the flexible section.

6. The wearable stress and/or strain indicator of claim 1, wherein the warning indicator displays a visual alert if the stress and/or strain to the wearable body is greater than a threshold amount.

7. The wearable stress and/or strain indicator of claim 1, wherein the warning indicator displays an audio alert if the stress and/or strain to the wearable body is greater than a threshold amount.

8. The wearable stress and/or strain indicator of claim 1 comprising a recorder for recording a stress and/or strain incident to the wearable body.

9. The wearable stress and/or strain indicator of claim 8, wherein the stress and/or strain incident is downloadable.

10. The wearable stress and/or strain indicator of claim 9, wherein the stress and/or strain incident is downloadable by a user of the wearable stress and/or strain indicator.

11. The wearable stress and/or strain indicator of claim 10, wherein the stress and/or strain incident is wirelessly sent to an electronic media device such as a smart phone, a tablet, and a computer.

12. The wearable stress and/or strain indicator of claim 9, wherein the stress and/or strain incident is downloadable by an original equipment manufacturer of the wearable stress and/or strain indicator.

13. An electronic system for detecting a level of stress and strain applied to a wearable product comprising:
   a. a wearable body;
   b. a strain gauge for detecting a stress and/or strain applied to the wearable body;
   c. a warning indicator; and
   d. a control device,
   wherein the strain gauge sends a signal to the control device based upon a stress and/or strain applied to the wearable body and the control device operates the warning indicator based upon the signal from the strain gauge, and wherein the warning indicator indicates a warning that the product is in danger of failing.

14. The system of claim 13, wherein the control device only operates the warning indicator if the stress and/or strain to the wearable body is greater than a threshold level.

15. The system of claim 13, wherein the warning indicator displays a visual alert if the stress and/or strain to the wearable body is greater than the threshold level.

16. The system of claim 13, wherein the warning indicator displays an audio alert if the stress and/or strain to the wearable body is greater than the threshold level.

17. The system of claim 13 comprising a recorder for recording the stress and/or strain incident to the wearable body.

18. The system of claim 17 wherein the stress and/or strain incident is downloadable.

19. The system of claim 18 wherein the stress and/or strain incident is downloadable by a user of the wearable body.

20. The system of claim 13 wherein the stress and/or strain incident is downloadable by an original equipment manufacturer of the electronic system.

21. A method of indicating a level of stress and strain applied to a wearable body, the method comprising:
   a. sensing a level of stress and/or strain applied to the wearable body;
   b. sending a signal to a control device based upon the level of stress and/or strain applied to the wearable body; and
   c. activating a warning based upon the level of stress and/or strain applied to the wearable body, and wherein the warning indicator indicates a warning that the electronic stress and strain indicator is in danger of failing.

22. The method of claim 21 wherein the warning is only activated if the stress and/or strain to the wearable body is greater than a threshold amount.

23. The method of claim 21 comprising recording the stress and/or strain incident.

24. The method of claim 23 comprising downloading the recorded stress and/or strain incident.

* * * * *